US012690503B2

(12) United States Patent
Nishiyama et al.

(10) Patent No.: US 12,690,503 B2
(45) Date of Patent: Jul. 21, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventors: Tomohiro Nishiyama, Tokyo (JP); Toshiyuki Hata, Tokyo (JP); Tatsuaki Tsukuda, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 791 days.

(21) Appl. No.: 18/060,680

(22) Filed: Dec. 1, 2022

(65) Prior Publication Data

US 2024/0186224 A1 Jun. 6, 2024

(51) Int. Cl.
  *H10W 90/00* (2026.01)
  *H10W 70/40* (2026.01)
  (Continued)

(52) U.S. Cl.
  CPC ....... *H10W 90/701* (2026.01); *H10W 70/465* (2026.01); *H10W 70/60* (2026.01); *H10W 70/65* (2026.01); *H10W 90/401* (2026.01); *H10W 72/5522* (2026.01); *H10W 72/884* (2026.01); *H10W 74/00* (2026.01); *H10W 90/756* (2026.01)

(58) Field of Classification Search
  CPC ........... H01L 23/49811; H01L 23/4952; H01L 23/49833; H01L 23/49838; H01L 24/18; H01L 24/48; H01L 24/73; H01L 2224/45144; H01L 2224/48091; H01L 2224/48247; H01L 2224/73265; H01L 2924/182; H01L 23/49503;
(Continued)

(56) References Cited

U.S. PATENT DOCUMENTS 5,126,813 A * 6/1992 Takahashi ......... H01L 23/49572
  257/417
6,208,020 B1 * 3/2001 Minamio ............ H01L 23/3107
  257/730
(Continued)

FOREIGN PATENT DOCUMENTS

JP    2001148454 A * 5/2001  ............ H01L 24/97
JP    2001208627 A * 8/2001
JP    2018-121035 A   8/2018

*Primary Examiner* — Teresa M. Arroyo
(74) *Attorney, Agent, or Firm* — Rimon P.C.

(57) ABSTRACT

Improving a performance of a semiconductor device. A method of manufacturing the semiconductor device, including steps of: forming a first convex portion on a front surface of a chip mounting portion; and mounting a semiconductor chip on the front surface of the chip mounting portion via a conductive adhesive material. Here, the semiconductor chip includes: a main transistor forming portion in which a main transistor is formed; and a sense transistor forming portion in which a sense transistor is formed. Also, in the step for mounting the semiconductor chip on the chip mounting portion, the semiconductor chip is mounted on the front surface of the chip mounting portion such that the sense transistor forming portion of the semiconductor chip overlaps the first convex portion formed on the front surface of the chip mounting portion in the step for forming the first convex portion.

7 Claims, 19 Drawing Sheets

(51) Int. Cl.

| | | |
|---|---|---|
| *H10W 70/60* | (2026.01) | |
| *H10W 70/65* | (2026.01) | |
| *H10W 72/00* | (2026.01) | |
| *H10W 72/50* | (2026.01) | |
| *H10W 74/00* | (2026.01) | |

(58) Field of Classification Search
CPC ......... H01L 23/49513; H01L 23/49562; H01L 24/29; H01L 24/32; H01L 24/83
See application file for complete search history.

(56) References Cited

U.S. PATENT DOCUMENTS

| | | | |
|---|---|---|---|
| 10,204,849 B2 | 2/2019 | Nakamura et al. | |
| 2007/0273017 A1* | 11/2007 | Maloney | H05K 3/341 |
| | | | 257/E23.037 |
| 2007/0278511 A1* | 12/2007 | Ohno | H01L 24/33 |
| | | | 257/E33.059 |
| 2015/0084169 A1* | 3/2015 | Yow | H01L 23/49568 |
| | | | 438/122 |
| 2016/0071787 A1* | 3/2016 | Chopin | H01L 23/49503 |
| | | | 257/676 |
| 2016/0225687 A1* | 8/2016 | Kim | H01L 23/645 |
| 2017/0084661 A1* | 3/2017 | Seddon | H01L 23/4951 |

\* cited by examiner

*FIG. 3*

SEMICONDUCTOR DEVICE AND METHOD OF MANUFACTURING THE SAME

BACKGROUND

The present disclosure relates to a semiconductor device, and more particularly, to a technique applicable to a semiconductor device including a main transistor and a sense transistor.

Here, there is disclosed technique listed below.

[Patent Document 1] Japanese Unexamined Patent Application Publication No. 2018-121035

Patent Document 1 discloses a technique for packaging a semiconductor device as a component of an inverter.

SUMMARY

For example, in a semiconductor device including a semiconductor chip in which a power transistor called a main transistor is formed, there is a semiconductor device including not only the main transistor, but also a sense transistor in order to detect a current flowing through the main transistor.

A shunt resistor externally provided in order to detect the current flowing through the main transistor is not necessary in such the semiconductor device. Therefore, the semiconductor device including the sense transistor is effective from the viewpoint of reducing the mounting area and the number of components.

Here, in a system in which a current flowing through a load is controlled by a main transistor, it is important to detect a current flowing through the main transistor with high accuracy in order to realize high efficiency control. Therefore, it is desired that the sense transistor detecting the current flowing through the main transistor has a highly accurate current detection function. That is, it is desired to improve the current sense function in the sense transistor.

Incidentally, it is conceivable to apply a high current to the sense transistor in order to enhance the current detection function of the sense transistor. However, since the sense transistor is used only for current detection, it is also desired to reduce power consumption during an operation of the sense transistor as much as possible.

A method of manufacturing a semiconductor device according to one embodiment, comprising steps of: forming a first convex portion on a front surface of a chip mounting portion; and mounting a semiconductor chip on the front surface of the chip mounting portion via a conductive adhesive material. Here, the semiconductor chip includes: a main transistor forming portion in which a main transistor is formed; and a sense transistor forming portion in which a sense transistor is formed. Also, in the step for mounting the semiconductor chip on the chip mounting portion, the semiconductor chip is mounted on the front surface of the chip mounting portion such that the sense transistor forming portion of the semiconductor chip overlaps the first convex portion formed on the front surface of the chip mounting portion in the step for forming the first convex portion.

A method of manufacturing a semiconductor device according to one embodiment, comprising steps of: forming a convex portion on a front surface of a chip mounting portion; and mounting a semiconductor chip on the front surface of the chip mounting portion via a conductive adhesive material. Here, the semiconductor chip includes: a main transistor forming portion in which a main transistor is formed; and a sense transistor forming portion in which a sense transistor is formed. Also, in the step for mounting the semiconductor chip on the chip mounting portion, the semiconductor chip is mounted on the front surface of the chip mounting portion such that the main transistor forming portion of the semiconductor chip overlaps the convex portion formed on the front surface of the chip mounting portion in the step for forming the convex portion, and such that the sense transistor forming portion of the semiconductor chip does not overlap the convex portion formed on the front surface of the chip mounting portion in the step for forming the convex portion.

A semiconductor device according to one embodiment, comprising: a semiconductor chip in which a main transistor and a sense transistor are formed; a chip mounting portion on which the semiconductor chip is mounted; and a conductive adhesive material interposed between the semiconductor chip and the chip mounting portion. Here, in the conductive adhesive material, a thickness of a first portion located between the sense transistor forming portion of the semiconductor chip and the chip mounting portion is less than a thickness of a second portion located between the main transistor forming portion of the semiconductor chip and the chip mounting portion.

BRIEF DESCRIPTION OF THE DRAWINGS

FIG. 3 is a schematic diagram showing a layout at a front surface of a semiconductor chip.

DETAILED DESCRIPTION

Figure 1:
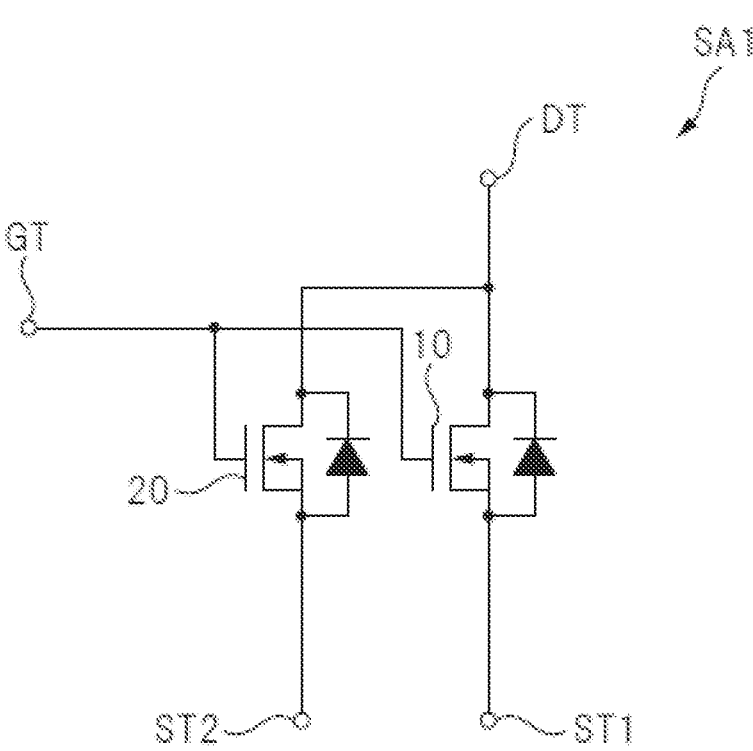
FIG. 1 is a diagram showing a circuit configuration of a semiconductor device including a power transistor.

In all the drawings for explaining the embodiments, the same members are denoted by the same reference numerals in principle, and repetitive descriptions thereof are omitted. Note that even plan view may be hatched for the sake of clarity.

<Circuit Configuration of Semiconductor Device>

FIG. 1 is a diagram showing a circuit configuration of a semiconductor device SA1 including a power transistor.

In FIG. 1, the semiconductor device SA1 includes a main transistor 10 including a power transistor and a sense transistor 20. Here, as the power transistor, a power MOS-FET or a IGBT (Insulated Gate Bipolar Transistor) is exemplified, but a description will be given assuming that the power transistor is formed of a power MOSFET in the present embodiment.

The main transistor 10 is provided between a drain terminal DT that supplies a power supply potential and a source terminal ST1 that is an output terminal. The main transistor 10 functions as a switching device for turning on/off a current flowing between the drain terminal DT and the source terminal ST1 according to a gate voltage applied to the gate terminal GT. On the other hand, the sense transistor 20 has a function of detecting a current value of a current flowing through the main transistor 10. The sense transistor 20 is provided between the drain terminal DT and the sense terminal ST2, and on/off is controlled by a gate voltage applied to the gate terminal GT.

The semiconductor device SA configured in this way is controlled by control circuitry (not shown). Specifically, the control circuit is configured to control on/off of the main transistor 10 included in the semiconductor device SA1 based on the control signal. That is, the control circuitry controls on/off of the main transistor 10 by switching the gate voltage applied to the gate electrode (gate terminal GT) of the main transistor 10. In this way, the current can be supplied from the source terminal ST1 of the main transistor 10 to the loads connected to the outside of the semiconductor device SA1 by the on/off control of the main transistor 10.

On the other hand, the sense transistor 20 included in semiconductor device SA1 is provided to detect the current flowing through the main transistor 10. For example, the main transistor 10 and the sense transistor 20 configure a current mirror circuit such that the ratio of the current value of the current flowing through the main transistor 10 to the current value of the current flowing through the sense transistor 20 (that is, the ratio of the current value of the current flowing through the main transistor 10 to the sense ratio) becomes "10000:1". The sense transistor 20 is connected to a sense circuit (not shown) via a sense terminal ST2, and a current flowing through the sense transistor 20 is changed to a voltage by the sense circuit, and a current value of the current flowing through the main transistor 10 is calculated by the control circuit based on the converted voltage signal and the "sense ratio".

The semiconductor device SA1 is configured as described above.

Here, for example, when a IGBT is used as the power transistor, a freewheel diode connected in anti-parallel with IGBT needs to be provided. On the other hand, when a power MOSFET is used as the power transistor, there is no need to provide a freewheel diode connected in anti-parallel with the power MOSFET. This is because, in the device-structure of the power MOSFET, the body diode, which is a pn junction diode, is formed parasitically, so that the body diode functions as a freewheel diode. However, even when a power MOSFET is used as the power transistor, a Schottky diode having a lower forward voltage drop than that of pn junction diode may be used as the freewheel diode.

The technical idea of the present embodiment can be applied to a configuration in which either a IGBT or a power MOSFET is used for a power transistor, but in the following explanation, an exemplary configuration in which a power transistor is formed of a power MOSFET will be described. Since the presence or absence of a freewheel diode is not directly related to the explanation of the technical idea in the present embodiment, the technical idea in the present embodiment will be explained below, for the sake of simplicity, assuming that the freewheel diode does not exist.

<Package Structure of Semiconductor Device>

Figure 2:
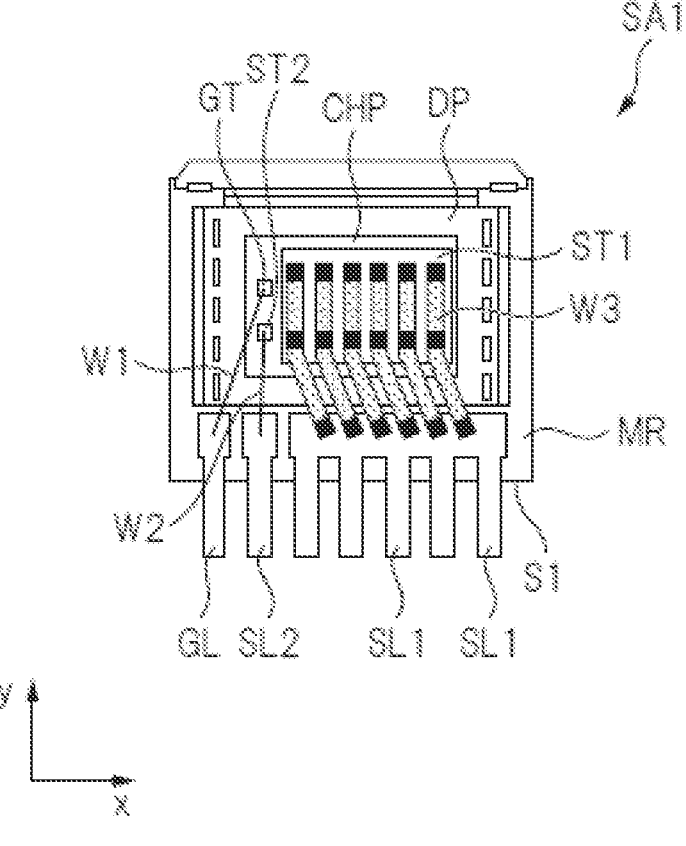
FIG. 2 is a diagram schematically showing an inner structure of the semiconductor device.

FIG. 2 is a diagram schematically showing an inner structure of the semiconductor device SA1.

In FIG. 2, for example, a die pad DP is disposed inside a resin-made encapsulant MR. A semiconductor chip CHP is mounted on the die pad DP. A power MOSFET is formed on the semiconductor chip CHP. Specifically, a main transistor and a sense transistor are formed in the semiconductor chip CHP.

A gate terminal GT electrically connected to the gate electrode of the main transistor and the gate electrode of the sense transistor, a source terminal ST1 electrically connected to the source region of the main transistor, and a sense terminal ST2 electrically connected to the source region of the sense transistor are formed on the top surface of the semiconductor chip CHP.

On the other hand, although not shown in FIG. 2, a common drain electrode (drain terminal) is formed in the main transistor and the sense transistor on the back surface of the semiconductor chip CHP, and the drain electrode is electrically connected to the die pad DP.

Next, a plurality of leads is arranged so as to protrude from the sealing member MR on the side S1 of the sealing member MR. Specifically, the plurality of leads includes a gate terminal lead GL, a sense terminal lead SL2, and a source terminal lead SL1.

The gate terminal lead GL is electrically connected to the gate terminal GT via a wire W1 that is a gate terminal connecting member. The sense terminal lead SL2 is electrically connected to the sense terminal ST2 via a wire W2 that is a sense terminal connecting member. The source terminal lead SL1 is electrically connected to the source terminal ST1 by a plurality of wire W3 that is a source terminal connecting member. Here, for example, the wire W1 or the wire W2 is a wire containing gold or copper as a main component, and the wire W3 is a wire containing aluminum as a main component.

Here, the term "main component" refers to the most abundant component, and is used to indicate that the inclusion of other components is not excluded. For example, "based on gold" means that it contains the most gold, and similarly, "based on aluminum" means that it contains the most aluminum.

In this way, semiconductor device SA that is the "TO packaging" is configured.

In the present embodiment, for example, as shown in FIG. 2, a "TO (Transistor Outline) package" is adopted as a package structure of the semiconductor device SA1 having the semiconductor chip on which a power MOSFET is formed. Here, the "TO package" is defined as a package structure in which a plurality of leads is arranged only on a first side of a semiconductor device in a plan view. In this regard, "TO package" differs from "SON (Small Outline Non-Leaded) package" and "SOP (Small Outline Package) package" in that a plurality of leads is arranged not only on the first side of the semiconductor device but also on the second side opposite the first side, and also differs from "QFN (Quad Flat Non-leaded) package" and "QFP (Quad Flat Package) package" in that a plurality of leads is arranged on all four sides of the semiconductor device. According to the "TO package" employed in the present embodiment, for example, since a plurality of leads is arranged only on the first side of the semiconductor device SA1, the wiring on the motherboard can be easily routed more easily than the other packages described above. For example, by adopting "TO package", it is possible to realize a mounting layout corresponding to an inverter circuit with a simplified layout.

<Layout of Semiconductor Chip>

Figure 3:
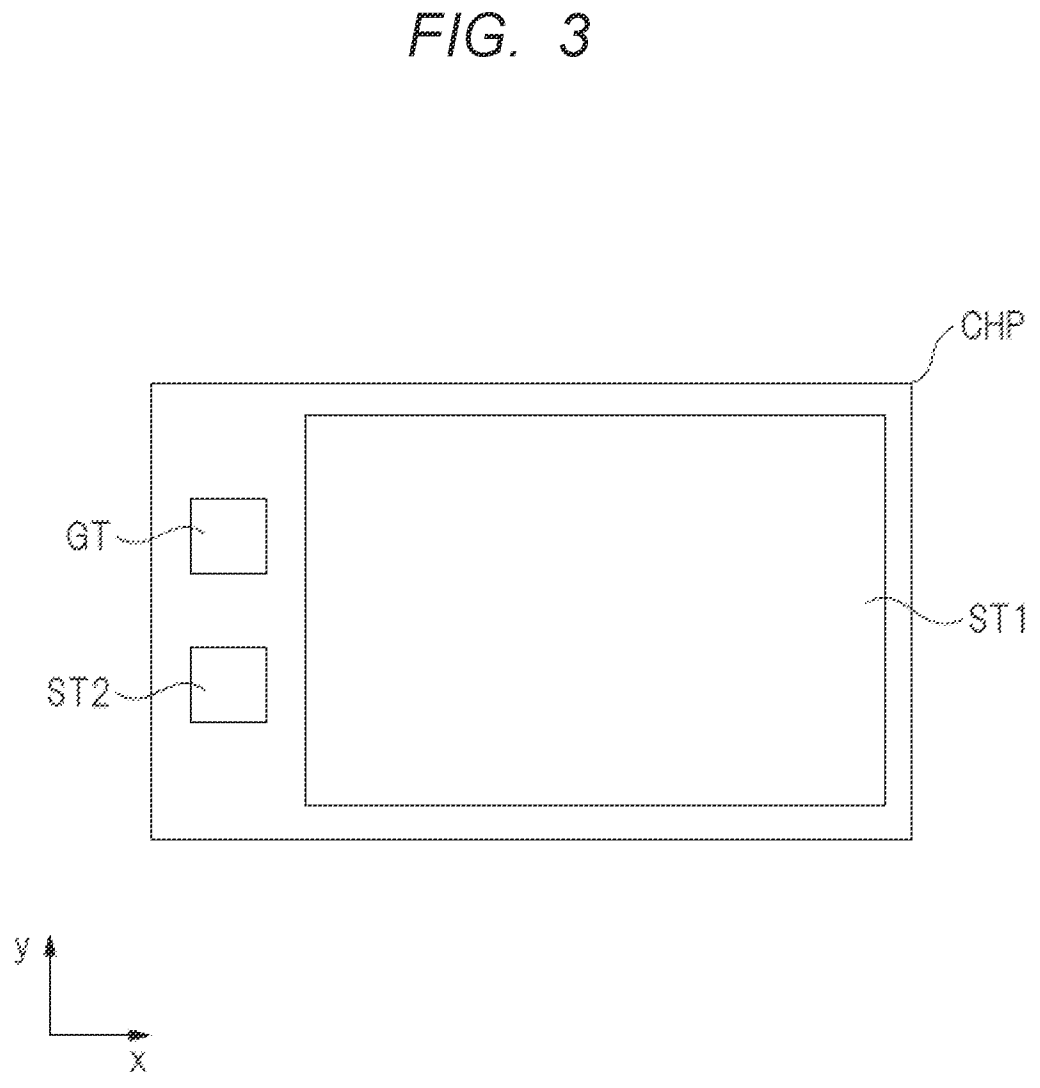

Next, the layout of the semiconductor chip CHP included in the semiconductor device SA1 will be described. FIG. 3 is a schematic diagram showing a layout at a front surface of the semiconductor chip CHP.

In FIG. 3, the semiconductor chip CHP has a rectangular planar shape. A source terminal ST1, a sense terminal ST2, and a gate terminal GT are formed on the semiconductor chip CHP. The source terminal ST1, the sense terminal ST2, and the gate terminal GT are provided at positions that do not overlap each other in plan view. Here, the source terminal ST1 may be referred to as a "source pad", and the sense terminal ST2 may be referred to as a "sense pad". The gate terminal GT may also be referred to as a "gate pad".

Figure 4:
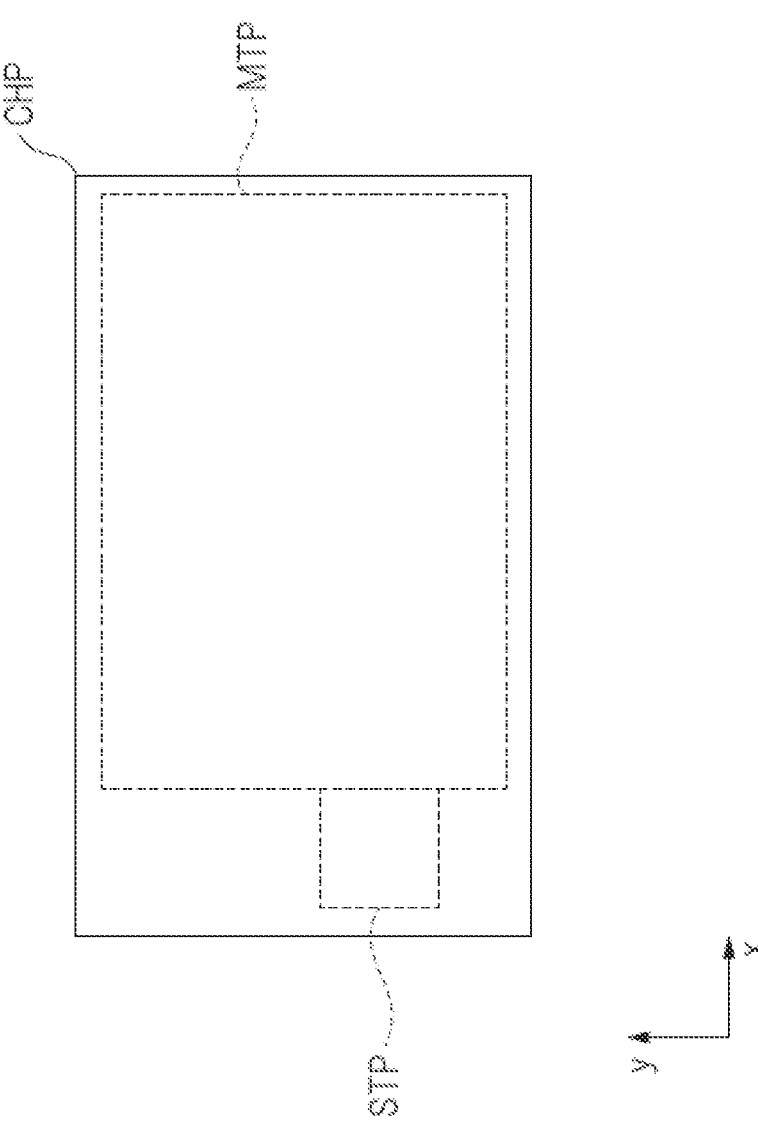
FIG. 4 is a schematic diagram showing a layout at an inner portion of the semiconductor chip.

Next, FIG. 4 is a schematic diagram showing a layout at an inner portion of the semiconductor chip CHP. In FIG. 4, a main transistor forming portion MTP in which a main transistor is formed and a sense transistor forming portion STP in which a sense transistor is formed are provided inside the semiconductor chip CHP. Here, the main transistor forming portion MTP is a main transistor forming region in which a main transistor is formed, and the sense transistor forming portion STP is a sense transistor forming region in which a sense transistor is formed.

Figure 5:
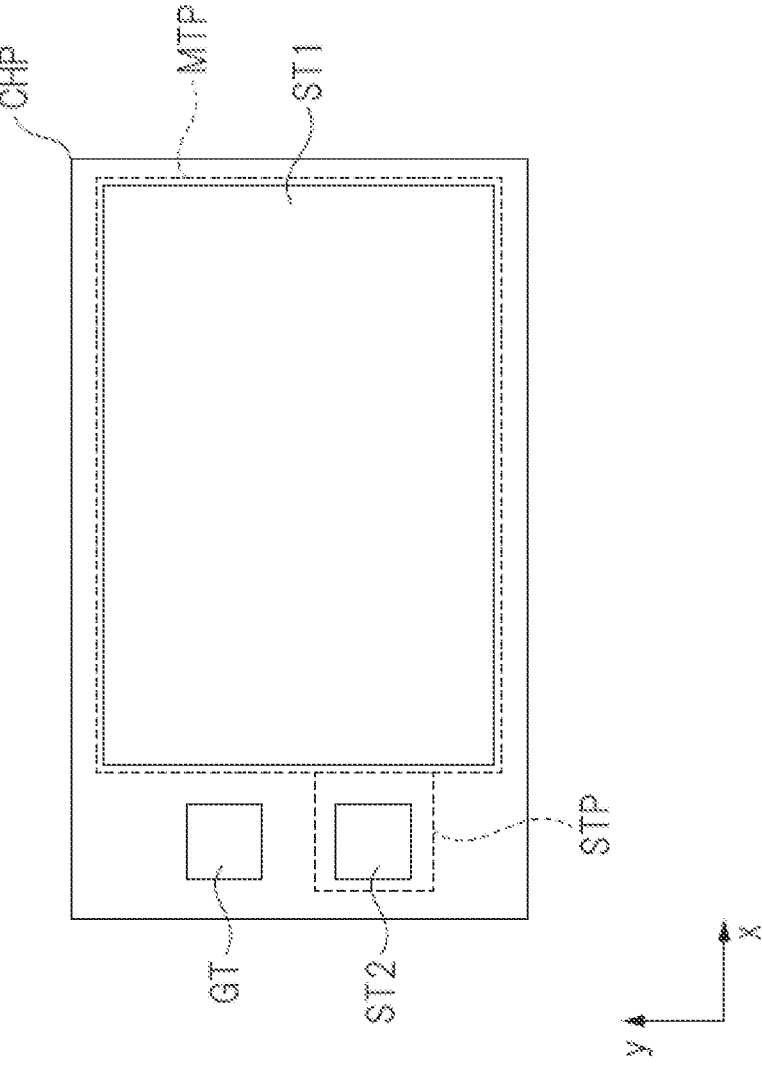
FIG. 5 is a diagram overlapping FIG. 3 and FIG. 4 with each other.

FIG. 5 is a diagram overlapping FIG. 3 and FIG. 4 with each other. In FIG. 5, a main transistor forming portion MTP is provided below the source terminal ST1. The source terminal ST1 is electrically connected to a source area of the main transistor formed in the main transistor forming portion MTP. On the other hand, a sense transistor forming portion STP is provided below the sense terminal ST2. The sense terminal ST2 is electrically connected to a source area of a sense transistor formed in the sense transistor forming unit STP. Further, the gate terminal GT is provided at a position not overlapping with the source terminal ST1 and the sense terminal ST2. The gate terminal GT is electrically connected to the gate electrode of the main transistor formed in the main transistor forming portion MTP, and is electrically connected to the gate electrode of the sense transistor formed in the sense transistor forming portion STP.

As described above, the semiconductor chip CHP is laid out.

<Consideration for Improvement>

In a system for controlling a current flowing through a load by a main transistor, it is important to detect a current flowing through the main transistor with high accuracy in order to realize high efficiency control. Therefore, a sense transistor having a function of detecting a current flowing through the main transistor is desired to have a highly accurate current detection function.

In this regard, improving the accuracy of current sensing in the sense transistor is achieved by improving the reproducibility of the current-density distribution in semiconductor device. This is because if the current density varies depending on the individual difference of semiconductor device, the accuracy of detecting the current in the sensing transistor varies depending on the individual difference. Therefore, it is essential to ensure the reproducibility of the current-density distribution in semiconductor device as much as possible regardless of individual differences.

Figure 6:
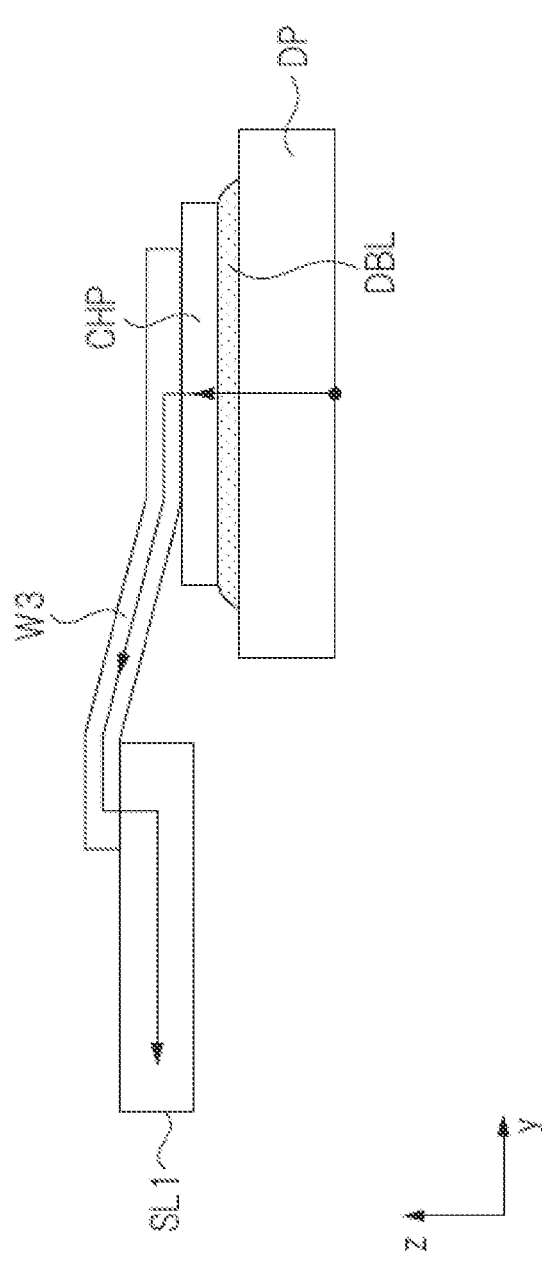
FIG. 6 is a diagram showing a current path in the semiconductor device.

FIG. 6 is a diagram showing a current path in the semiconductor device SA1.

In FIG. 6, a current flowing through the semiconductor device SA1 passes through a path of "Die pad DP→Solder layer DBL→Back surface electrode of semiconductor chip CHP→Main transistor in semiconductor chip CHP→Source terminal formed on front surface of semiconductor chip CHP→Wire W3→Source terminal lead SL1". Here, the present inventors focused on DBL of solder layers as the main cause of the variation in the current-density-distribution. Specifically, it has been newly found that voids generated in the solder layer DBL are irregularly present, which adversely affects the reproducibility of the current-density distribution flowing through the solder layer DBL. Therefore, it is desired to secure reproducibility against irregular generation of voids. In the following, the technical idea of the present embodiment with this contrivance will be described.

Basic Thought in Embodiment

The present inventors have studied how to improve reproducibility against irregular generation of voids. First, it is conceivable to completely eliminate the generation of voids in the solder layer DBL, but it is very difficult to realize it. Next, it is conceivable to make the generation state of voids uniform in the plane, but it is difficult to generate a difference in location between the central and the outside. Furthermore, it is conceivable that the void distribution is the same each time. However, in this case, it is difficult to finely control the void distribution in the solder melting process. Therefore, the present inventors have conceived that voids are stably eliminated by limiting the area immediately below the sense transistor. This is because the region in which the sense transistor is formed is relatively narrow and can be expected to be easily controlled, while the region in which the main transistor is formed is large, and even if voids are irregularly generated, the influence on the variation of the "sense ratio" is considered to be relatively small. In other words, the region in which the sense transistor is formed is small, and if voids are irregularly generated in this region, the influence on the variation of the "sense ratio" is considered to be large.

As described above, the basic thought in the present embodiment is that voids are stably eliminated by limiting the region immediately below the sense transistor, which is likely to adversely affect the reproducibility of the current-density distribution with respect to irregular generation of voids. This basic thought is realized by making the thickness of the conductive adhesive material interposed between the sense transistor forming portion of the semiconductor chip and the die pad smaller than the thickness of the conductive adhesive material interposed between the main transistor forming portion of the semiconductor chip and the die pad. This is because it is considered that voids are less likely to be generated in a region where the thickness of the conductive adhesive material is small than in a region where the thickness of the conductive adhesive material is large.

In the present embodiment, solder may be exemplified as an exemplary conductive adhesive material, but the basic thought in the present embodiment is not limited thereto, and may be applied to, for example, a silver paste or a paste based on a sintered material such as silver or copper.

"Conductive adhesive material" is used as a broad concept including solder and silver paste. In the following, an embodiment embodying the above-described basic concept will be described.

First Embodiment

In a first embodiment, by providing a convex portion on the front surface of the die pad so as to overlap with the sense transistor forming portion of the semiconductor chip, the thickness of the solder layer interposed between the sense transistor forming portion of the semiconductor chip and the die pad is made smaller than the thickness of the solder layer interposed between the main transistor forming portion of the semiconductor chip and the die pad. That is, in the first embodiment, the above-described basic thought is embodied by providing a convex portion on the front surface of the die pad so as to overlap with the sense transistor forming portion of the semiconductor chip.

<<Structure of Each of Semiconductor Chip and Convex Portion on Die Pad>>

Figure 7:
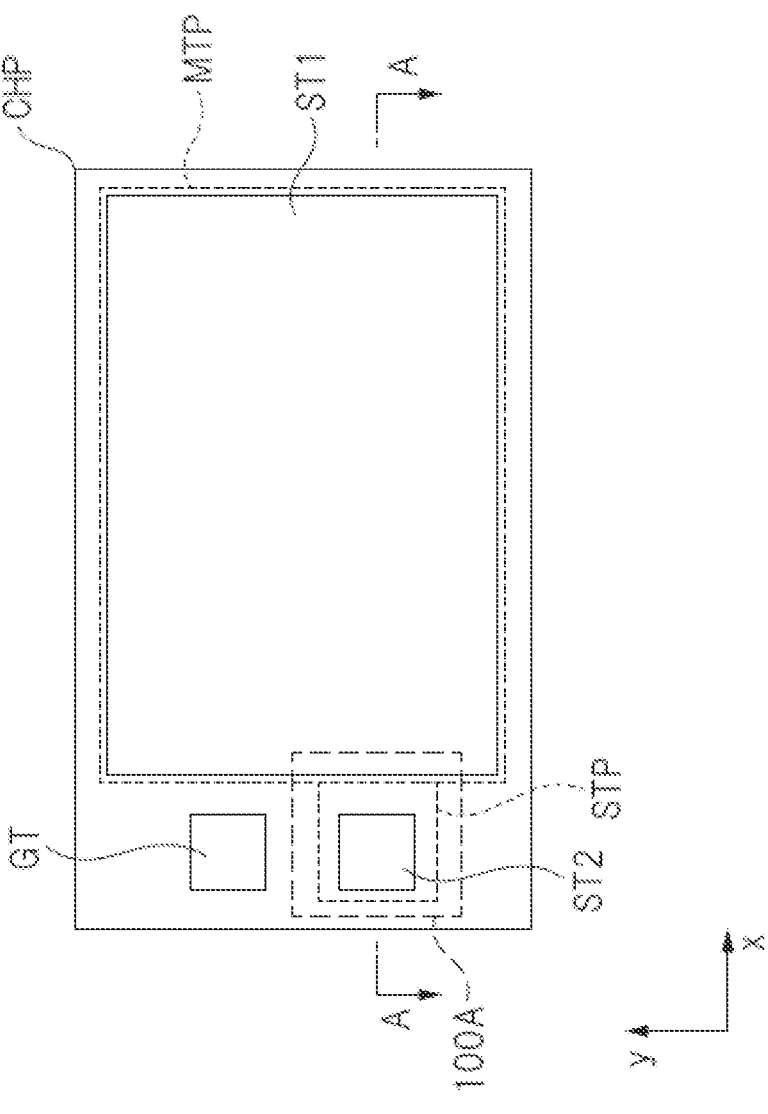
FIG. 7 is a diagram showing a layout of a semiconductor chip according to a first embodiment.

FIG. 7 is a diagram showing a layout of the semiconductor chip CHP according to a first embodiment.

In FIG. 7, the sense transistor forming portion CHP formed in the semiconductor chip STP and the main transistor forming portion MTP are also shown in perspective, and the protruding portion 100A formed in the die pad on which the semiconductor chip is mounted is also shown in perspective. In FIG. 7, a source terminal ST1, a gate terminal GT, and a sense terminal ST2 are formed on the semiconductor chip CHP. Inside the semiconductor chip CHP, a main transistor forming portion MTP in which a main transistor is formed and a sense transistor forming portion STP in which a sense transistor is formed are provided.

At this time, the source area of the main transistor formed in the main transistor forming portion MTP is electrically connected to the source terminal ST1. The gate electrode of the main transistor is electrically connected to the gate terminal GT. On the other hand, a source region of the sense transistor formed in the sense transistor forming portion STP is electrically connected to the sense terminal ST2. The gate electrode of the sense transistor is electrically connected to the gate terminal GT.

Further, in FIG. 7, a convex portion 100A formed on the die pad on which the semiconductor chip CHP is mounted is also illustrated. The convex portion 100A is formed so as to overlap with the sense transistor forming portion STP formed on the semiconductor chip CHP in a plan view. In other words, the protruding portion 100A formed on the die pad is provided so as to include the sense-transistor forming portion STP formed on the semiconductor chip CHP in a plan view. Here, for example, the planar size of the convex portion 100A is equal to or larger than the planar size of the sense transistor forming portion STP. In addition, it is desirable that the planar size of the protrusion 100A is 10% or less of the planar size of the semiconductor chip CHP.

In this way, the semiconductor chip CHP is laid out.

Figure 8:
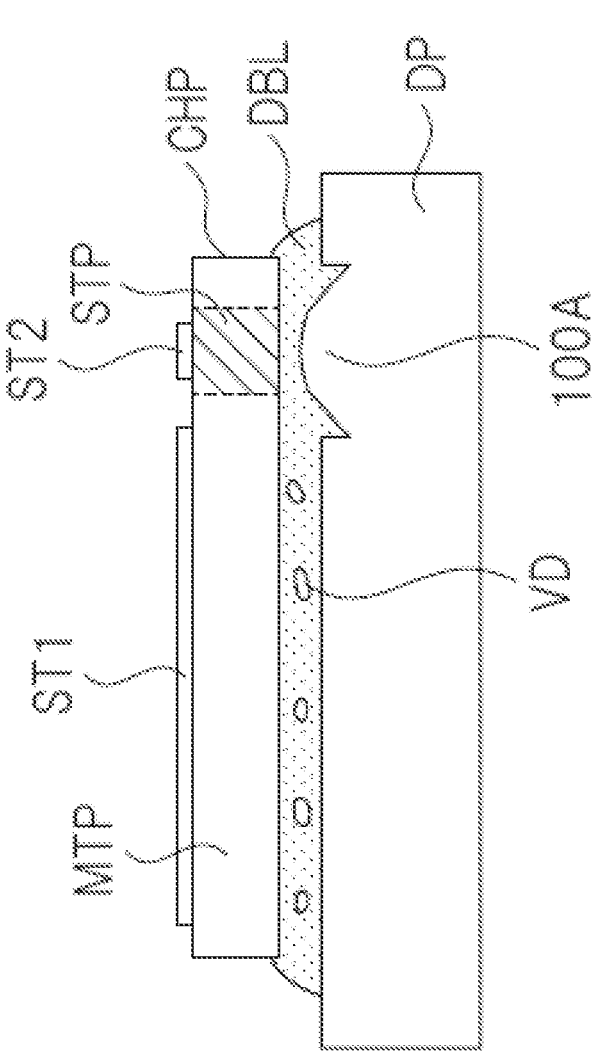
FIG. 8 is a cross-sectional view cutting along A-A line of FIG. 7.

Next, FIG. 8 is a cross-sectional view cutting along A-A line of FIG. 7.

In FIG. 8, the semiconductor chip CHP is mounted on a die pad DP via a solder layer DBL. A source terminal ST1 and a sense terminal ST2 are formed on the semiconductor chip CHP. In addition, a main transistor forming portion MTP and a sense transistor forming portion STP are provided inside the semiconductor chip CHP. On the other hand, a protrusion 100A is formed on the die pad DP. The protruding portion 100A is formed in a region immediately below the sense-transistor forming portion STP in a cross-sectional view. Consequently, as shown in FIG. 8, the thickness of the semiconductor chip CHP between the sense transistor forming portion STP and the die pad DP is smaller than the thickness of the solder layer DBL between the main transistor forming portion MTP and the die pad DP of the semiconductor chip DBL. As a result, as shown in FIG. 8, it is possible to prevent void VD from being formed in the solder layers DBL in the regions immediately below the sense-transistor forming portions STP. This is because the die pad STP in the region immediately below the sense transistor forming portion DP is formed with the protruding portion 100A, so that the thickness of the solder layers DBL interposed between the sense transistor forming portion 100A and the protruding portion can be reduced. That is, considering that voids are less likely to occur as the thickness of the solder layer DBL results, by providing the die pad DP in the region immediately below the sense transistor forming portion STP with the convex portion 100A, the solder layer DBL interposed between the sense transistor forming portion STP and the convex portion 100A becomes thinner, so that the void VD can be stably eliminated in the solder layer DBL in the region immediately below the sense transistor forming portion STP.

Therefore, according to the first embodiment, it is possible to suppress generation of irregular voids in a region immediately below the sense-transistor forming portion STP in which the reproducibility of the current-density distribution is likely to be adversely affected by irregular generation of voids. As a consequence, according to the first embodiment, the reproducibility of the current-density distribution in the solder layer DBL in the area immediately below the sense-transistor forming portion STP can be improved. Therefore, according to the first embodiment, it is possible to improve the current detection accuracy in the sense transistor by suppressing the variation in the current detection accuracy in the sense transistor for each individual difference.

<<Method for Forming Convex Portion>>

Figure 9:
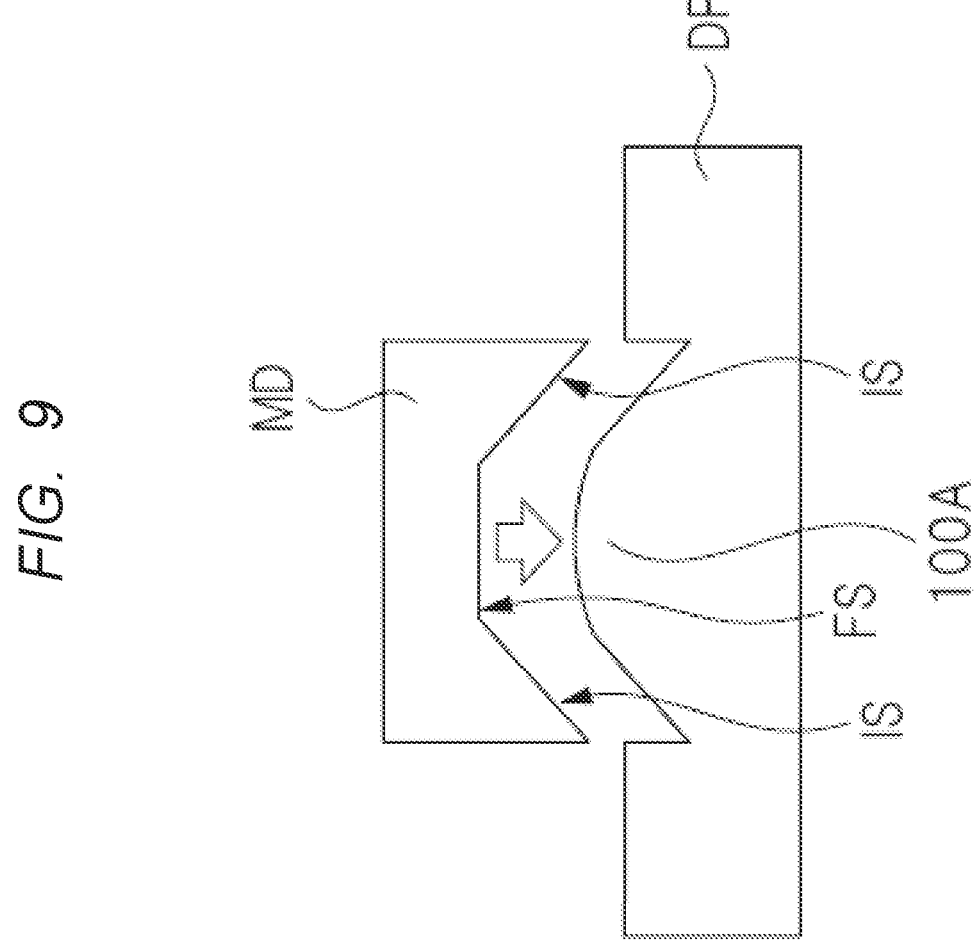
FIG. 9 is a diagram showing an example of a method for forming a convex portion.

For example, as illustrated in FIG. 9, the convex portion 100A described above can form the convex portion 100A on the front surface of the die pad DP by pressing the mold MD having the concave portion formed thereon against the front surface of the die pad DP. Specifically, first, as shown in FIG. 9, the mold MD used in the present embodiment includes a facing surface (bottom surface of the concave portion) FS facing the front surface of the die pad DP, and an inclined surface IS located around the facing surface FS and inclined with respect to the opposing surface FS. Then, in the step of pressing the mold MD against the front surface of the die pad DP, the pressing amount (lowering amount, moving amount) of the mold MD is set to a pressing amount so that the facing surface FS composing the concave portion of the mold MD does not contact with the raised front surface of the die pad DP, which is to be formed by pressing the mold MD against the front surface of the die pad DP. Thus, as shown in FIGS. 8 and 9, a portion of the raised convex portion 100A, which is corresponding to the inclined surface IS of the mold MD, is a flat surface, while a portion of the raised convex portion 100A, which is corresponding to the facing surface FS of the mold MD, is a curved surface.

Although the above description has been made as a method of forming the convex portion 100A in the present embodiment, by increasing the pushing amount (lowering amount, moving amount) of the mold MD, the portion corresponding to the facing surface FS of the mold MD of the raised convex portion may also be a flat surface. That is, the convex portion may be formed so as to follow the shape of the concave portion of the mold MD. This makes it possible to stably form the shape of the convex portion. On the other hand, when the thickness of the lead frame to be used (that is, the die pad DP) is small, the die pad DP may be deformed (that is, the die pad MD may not be kept flat) or a part (end portion of the inclined surface IS) of the mold MD may penetrate the die pad DP, if the press-in quantity of the mold MD is excessively increased. Therefore, when the thickness of the die pad DP is small, it is preferable to press the mold MD against the die pad DP by the forming process (i.e., the pressing amount) as in the above-described embodiment.

<<Method of Manufacturing Semiconductor Device>>

Next, manufacturing method of semiconductor device will be described.

Figure 10:
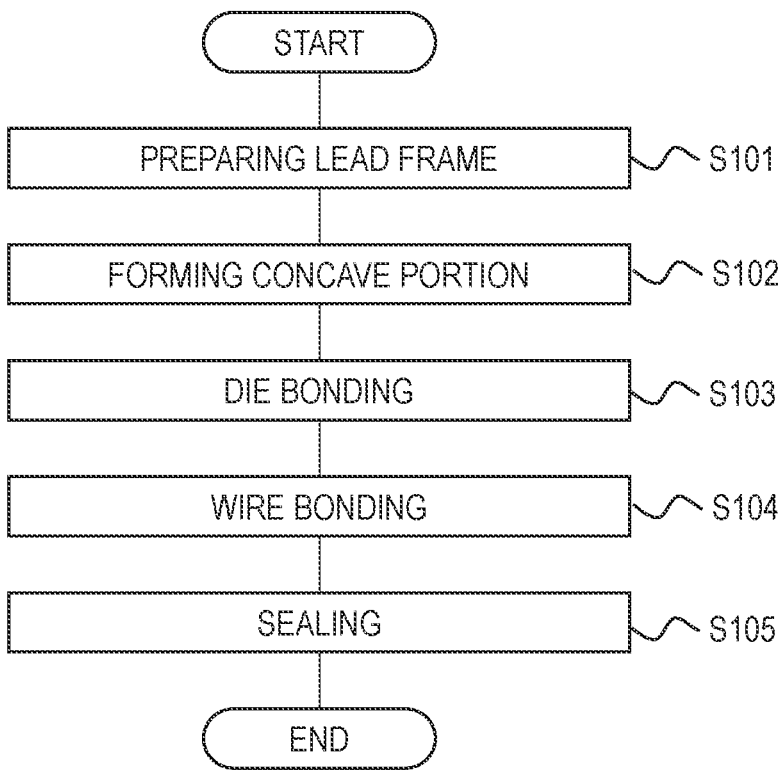
FIG. 10 is a flowchart for explaining a manufacturing process of the semiconductor device.

FIG. 10 is a flowchart for explaining a manufacturing process of the semiconductor device.

First, a lead frame having a die pad and a lead is prepared (S101). Then, a convex portion is formed on a front surface of the die pad (S102). Specifically, for example, the convex portion is formed by pressing a mold having a concave portion against the front surface of the die pad.

After that, a solder layer is formed on the front surface of the die pad on which the convex portion is formed, and the semiconductor chip is mounted on the die pad via the solder layer (S103). At this time, a main transistor forming portion in which a main transistor is formed and a sense transistor forming portion in which a sense transistor is formed are provided in the semiconductor chip. A source terminal, a gate terminal and a sense terminal are formed on the front surface of the semiconductor chip. Here, the semiconductor chip is mounted on the die pad via the solder layer so that a region immediately below the sense transistor forming portion is included in the convex portion in a perspective plan view. In other words, the semiconductor chip is mounted on the front surface of the die pad such that the sense transistor forming portion of the semiconductor chip overlaps the convex portion formed on the front surface of the die pad. Thus, according to the present embodiment, the thickness of a first portion in the solder layer, which is located between the sense transistor forming portion of the semiconductor chip and the die pad, is less than the thickness of a second portion in the solder layer, which is located between the main transistor forming portion of the semiconductor chip and the die pad.

As a result, in the region where the thickness of the solder layer is small, voids are less likely to be formed, and even if voids are formed, when the semiconductor chip is mounted on the die pad, the formed voids are pushed out to the outer region of the convex portion due to the presence of the convex portion. As a result, it is possible to stably eliminate voids from the solder layer existing in the region immediately below the sense transistor formation portion.

Thereafter, the gate terminal and the gate terminal lead formed on the front surface of the semiconductor chip are connected by a gold wire, and the sense terminal and the sense terminal lead formed on the front surface of the semiconductor chip are connected by a gold wire (S104). In addition, the source terminal and the lead for the source terminal are connected to each other by an aluminum wire (S104).

Subsequently, a sealing member is formed by resin-sealing (molding) (S105). Then, a plating layer is formed on the outer lead portion of the lead exposed from the sealing body as necessary. Next, the sealing body is separated from the frame frame of the lead frame by cutting the lead at a predetermined position outside the sealing body. Subsequently, the outer lead portion of the lead protruding from the sealing body is bent. As described above, semiconductor device can be manufactured.

Feature of First Embodiment

Next, feature points in the first embodiment will be described.

The characteristic point of the first embodiment is, for example, as shown in FIG. 8, that a convex portion 100A is provided on the die pad DP so as to overlap with the sense transistor forming portion STP of the semiconductor chip CHP. Thus, according to the characteristic point of the first embodiment, the basic thought of making the thickness of a first portion in the solder layer DBL, which is located between the sense transistor forming portion STP of the semiconductor chip CHP and the die pad DP, less than the thickness of a second portion in the solder layer DBL, which is located between the main transistor forming portion MTP of the semiconductor chip DP and the die pad CHP, is realized.

That is, according to the first embodiment, since the protrusions STP are formed on the die pad DP in the region immediately below the sense transistor forming portion STP, the thickness of the solder layers 100A interposed between the sense transistor forming portion and the protrusions DBL can be reduced.

Consequently, as shown in FIG. 8, it is possible to prevent void VD from being formed in the solder layers DBL in the regions immediately below the sense transistor forming portions STP. This is because the smaller the thickness of the solder layer DBL is, the less the voids are generated, and even if the void VD is generated, the void VD is pushed out to the outer area of the convex portion 100A by the convex portion 100A. Therefore, by providing the convex portion 100A in the die pad DP in the region immediately below the sense transistor forming portion STP, the solder layer DBL interposed between the sense transistor forming portion STP and the convex portion 100A becomes thin, so that the void VD can be stably eliminated in the solder layer DBL in the region immediately below the sense transistor forming portion STP.

As described above, according to the first embodiment, it is possible to suppress generation of irregular voids in a region immediately below the sense-transistor forming portion STP which is likely to adversely affect reproducibility of the current-density distribution with respect to irregular generation of voids. This means that, according to the first embodiment, the reproducibility of the current-density distribution in the solder layer DBL immediately below the sense-transistor forming portion STP can be improved. Therefore, according to the first embodiment, it is possible to suppress variation in the current detection accuracy in the sense transistor for each individual difference, and thus it is possible to improve the current detection accuracy in the sense transistor.

In particular, in the first embodiment, for example, as shown in FIG. 7, the convex portion 100A is formed so as to include the sense-transistor forming portion STP in a plan view. This makes it possible to reduce the thickness of the solder layers throughout the sensing transistor forming portion STP. Therefore, according to the first embodiment, voids can be stably eliminated over the entire area immediately below the sense transistor forming portion STP. However, the planar size of the protrusion 100A is preferably 10% or less of the planar size of the semiconductor chip CHP. This is because, if the convex portion 100A is too large, it is difficult to stably eliminate voids in the entire region immediately below the sense transistor forming portion STP because the protrusion VD cannot be pushed out to the outer region of the convex portion 100A.

First Modified Example

For example, as shown in FIG. 8, when the protrusion 100A is provided on the front face of the die pad DP in the region immediately below the sense transistor forming portion STP, it may be difficult to arrange the semiconductor chip CHP horizontally on the die pad DP. In this case, for example, it may be difficult to stably fix the semiconductor chip CHP, which may hinder the wire bonding process.

Figure 11:
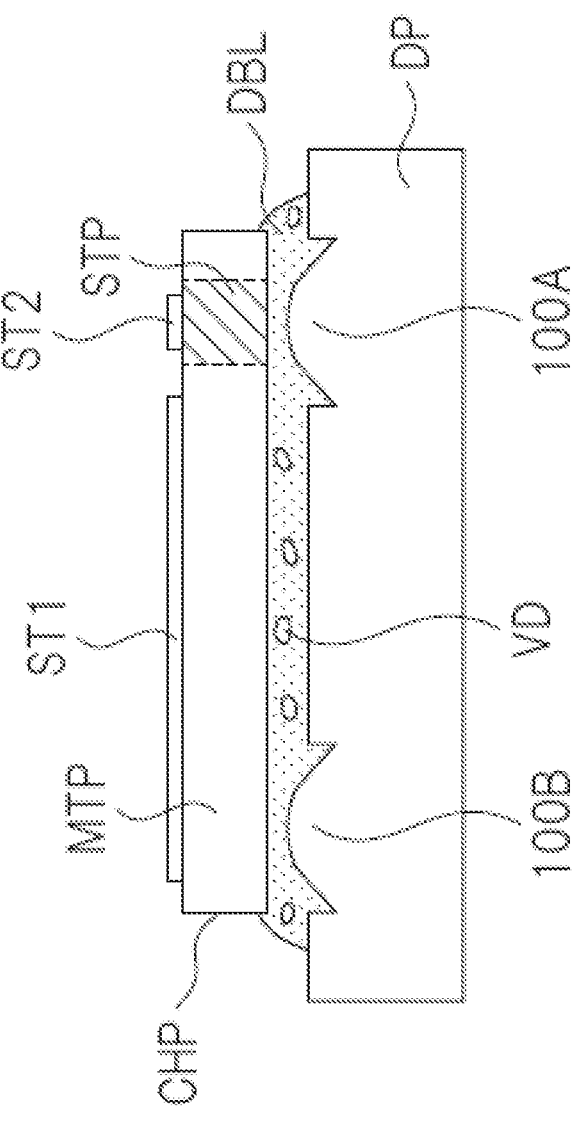
FIG. 11 is a diagram showing a first modified example.

Therefore, for example, as shown in FIG. 11, in the region immediately below the sense transistor forming portion STP, not only the front surface of the die pad DP is provided with the convex portion 100A, but also the front surface of the die pad DP is provided with the convex portion 100B so as to overlap with the main transistor forming portion MTP. According to this configuration, the semiconductor chip CHP can be stably and horizontally arranged by the plurality of protrusions, i.e., the protrusion 100A and the protrusion 100B. Accordingly, according to the present first modified example, it is possible to prevent a trouble in the wire bonding step.

Second Modified Exampler

Figure 12:
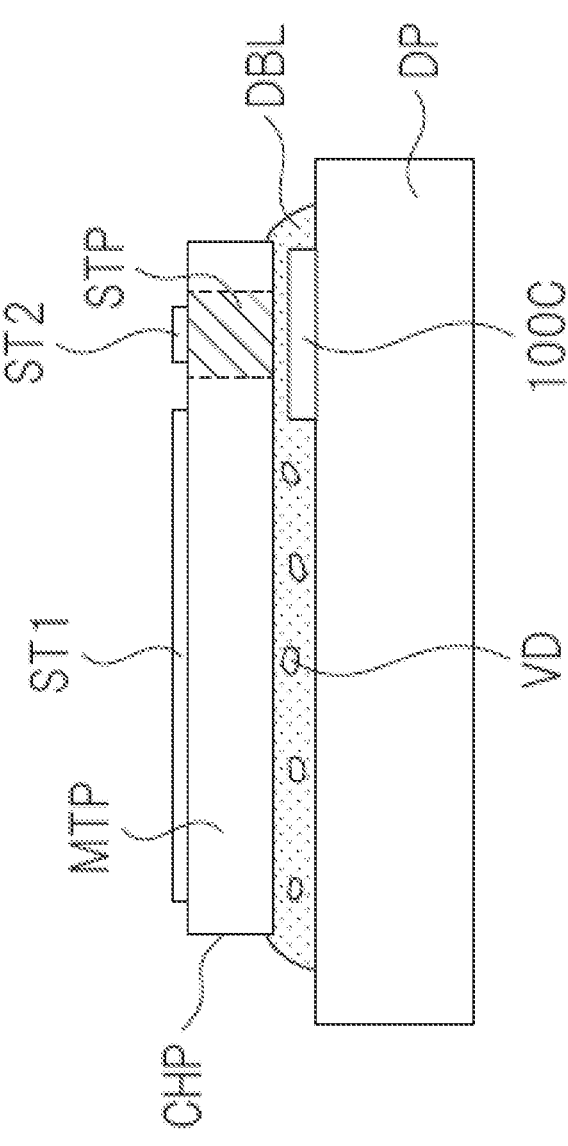
FIG. 12 is a diagram showing one embodiment of a second modified example.

In the first embodiment, for example, as shown in FIG. 9, an embodiment has been described in which a convex portion 100A is formed on the front surface of the die pad DP by pressing the mold MD having the concave portion formed thereon against the front surface of the die pad DP. However, the protruding portion is not limited to such methods, and for example, as shown in FIG. 12, a protruding portion 100C made of a film may be partially formed on the die pad DP.

In this case, as an example of the film, a silver-plated film can be exemplified. That is, by partially forming the plating film on the front surface of the die pad DP, also by forming the convex portion 100C made of the plating film, the semiconductor chip CHP sense transistor forming portion STP and the die pad DP the thickness of the solder layer DBL interposed between the main transistor forming portion MTP and the die pad DP of the semiconductor chip CHP it is possible to embody the basic thought of being smaller than the thickness of the solder layer OOG interposed between. In other words, by providing the protrusion 100C formed of the plating film, it is possible to stably eliminate the void VD in the solder layers DBL in the regions immediately below the sense-transistor forming portions STP.

Figure 13:
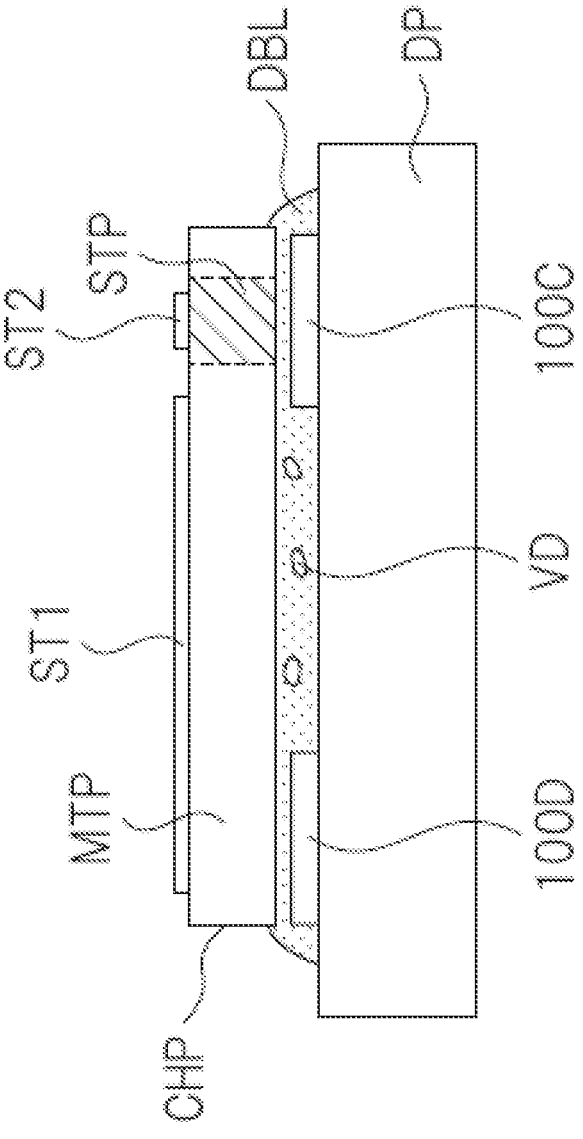
FIG. 13 is a diagram showing another embodiment of the second modified example.

Also in the present second modified example, as shown in FIG. 13, in the region immediately below the sense transistor forming portion STP, not only the convex portion DP is provided on the front surface of the die pad 100C but also the convex portion 100D can be provided on the front surface of the die pad DP so as to overlap with the main transistor forming portion MTP. According to this configuration, the semiconductor chip CHP can be stably and horizontally arranged by the plurality of protrusions, i.e., the protrusion 100C and the protrusion 100D.

Third Modified Example

Figure 14:
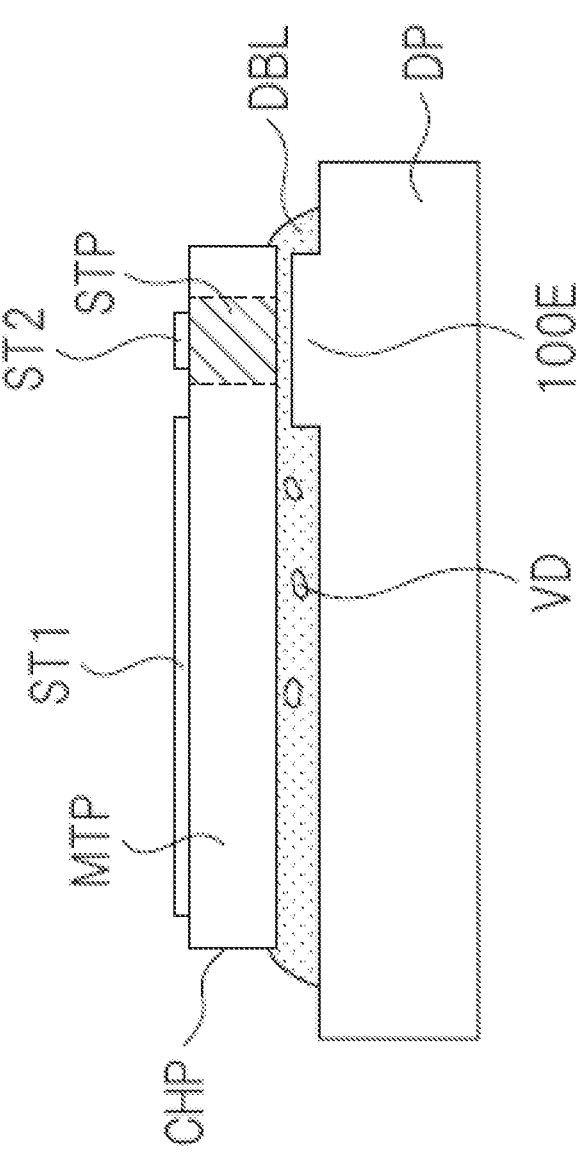
FIG. 14 is a diagram showing one embodiment of a third modified example.

In the first embodiment, for example, as shown in FIG. 9, an embodiment has been described in which a convex portion 100A is formed on the front surface of the die pad DP by pressing the mold MD having the concave portion formed thereon against the front surface of the die pad DP. However, the protruding portion is not limited to such methods, and for example, as shown in FIG. 14, the protruding portion 100E can be formed by partially etching the front surface on the die pad DP. As described above, by forming the convex portion 100E by etching, it is possible to realize the basic thought of making the thickness of the solder layer DBL interposed between the sense transistor forming portion STP of the semiconductor chip CHP and the die pad DP smaller than the thickness of the solder layer DBL interposed between the main transistor forming portion MTP of the semiconductor chip CHP and the die pad DP. That is, by partially etching the front surface of the die pad DP to provide the convex portion 100E, the void VD can be stably eliminated in the solder layer DBL in the region immediately below the sense transistor forming portion STP.

Figure 15:
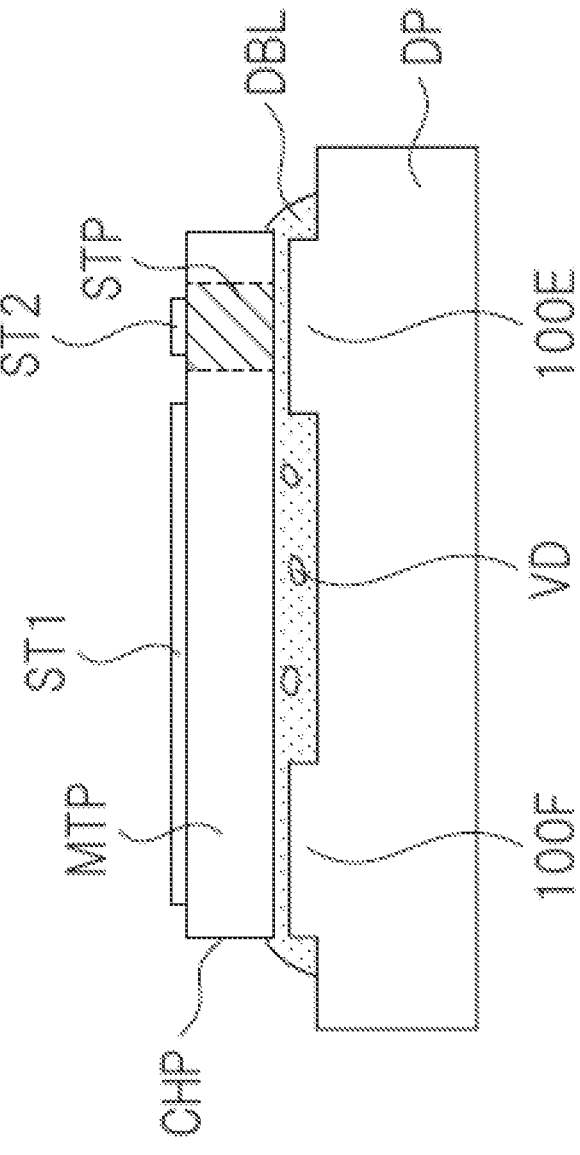
FIG. 15 is a diagram showing another embodiment of the third modified example.

Also, in the present third modified example, as shown in FIG. 15, in the region immediately below the sense transistor forming portion STP, not only the convex portion DP is provided on the front surface of the die pad 100E but also the convex portion 100F can be provided on the front surface of the die pad DP so as to overlap with the main transistor forming portion MTP. According to this configuration, the semiconductor chip CHP can be stably and horizontally arranged by the plurality of protrusions, i.e., the protrusion 100E and the protrusion 100F.

Second Embodiment

In a second embodiment, by providing the convex portion on the front surface of the die pad so as to overlap with the main transistor forming portion of the semiconductor chip, the thickness of the solder layer interposed between the sense transistor forming portion of the semiconductor chip and the die pad is made smaller than the thickness of the solder layer interposed between the main transistor forming portion of the semiconductor chip and the die pad. That is, in the embodiment 2, the above-described basic concept is embodied by providing the convex portion on the front surface of the die pad so as to overlap with the main transistor forming portion of the semiconductor chip. In other detailed expressions, the semiconductor chip is mounted on the front surface of the die pad such that the main transistor forming portion of the semiconductor chip overlaps the convex portion formed on the front surface of the die pad, and such that the sense transistor forming portion of the semiconductor chip does not overlap the convex portion formed on the front surface of the die pad. Thus, the above-described basic thought is embodied.

Figure 16:
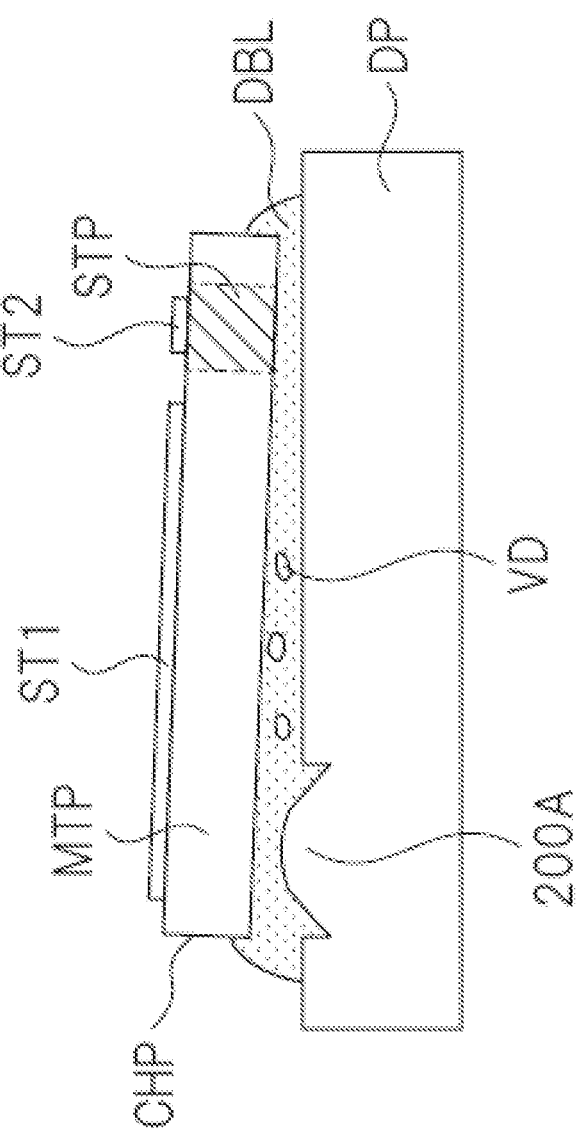
FIG. 16 is a diagram showing a semiconductor device according to a second embodiment.

FIG. 16 is a diagram showing a semiconductor device according to a second embodiment.

In FIG. 16, the semiconductor chip CHP is mounted on a die pad DP via a solder layer DBL. A source terminal ST1 and a sense terminal ST2 are formed on the semiconductor chip CHP. In addition, a main transistor forming portion MTP and a sense transistor forming portion STP are provided inside the semiconductor chip CHP. On the other hand, a protrusion 200A is formed on the die pad DP. The protrusion 200A is formed in an area immediately below the main transistor forming portion MTP in a cross-sectional view. Consequently, as shown in FIG. 16, the semiconductor chip CHP is inclined on the die pad DP. Accordingly, the thickness of the semiconductor chip CHP between the sense transistor forming portion STP and the die pad DP is smaller than the thickness of the solder layer DBL between the main transistor forming portion MTP and the die pad DP in the semiconductor chip DBL. In other words, the thickness of the solder layers DBL interposed between the sense transistor forming portions STP and the die pad DP of the semiconductor chip CHP is smaller than the height of the protrusion 200A.

As a result, as shown in FIG. 16, it is possible to prevent void VD from being formed in the solder layers DBL in the regions immediately below the sense-transistor forming portions STP. This is because, in the die pad DP in the region immediately below the main transistor forming portion MTP, the convex portion 200A is formed and the semiconductor chip CHP is inclined, so that the thickness of the solder layer DBL interposed between the sense transistor forming portion STP and the die pad DP can be reduced. That is, considering that voids are less likely to occur as the thickness of the solder layer DBL results, it is possible to stably eliminate the void MTP in the solder layer DBL in the region immediately below the main transistor forming portion VD by providing the convex portion DP in the region immediately below the main transistor forming portion STP and disposing the semiconductor chip CHP at an angle so that the solder layer DBL interposed between the sense transistor forming portion STP and the die pad DP becomes thinner.

Therefore, according to the embodiment 2, it is possible to suppress generation of irregular voids in the area immediately below the sense-transistor forming portion STP which is likely to adversely affect the reproducibility of the current-density distribution with respect to irregular generation of voids. As a consequence, according to the second embodiment, the reproducibility of the current-density distribution in the solder layer DBL in the area immediately below the sense-transistor forming portion STP can be improved. Therefore, according to the embodiment 2, it is possible to improve the current detection accuracy in the sense transistor by suppressing the variation in the current detection accuracy in the sense transistor for each individual difference.

<<Method for Foming Convex Portion>>

Figure 17:
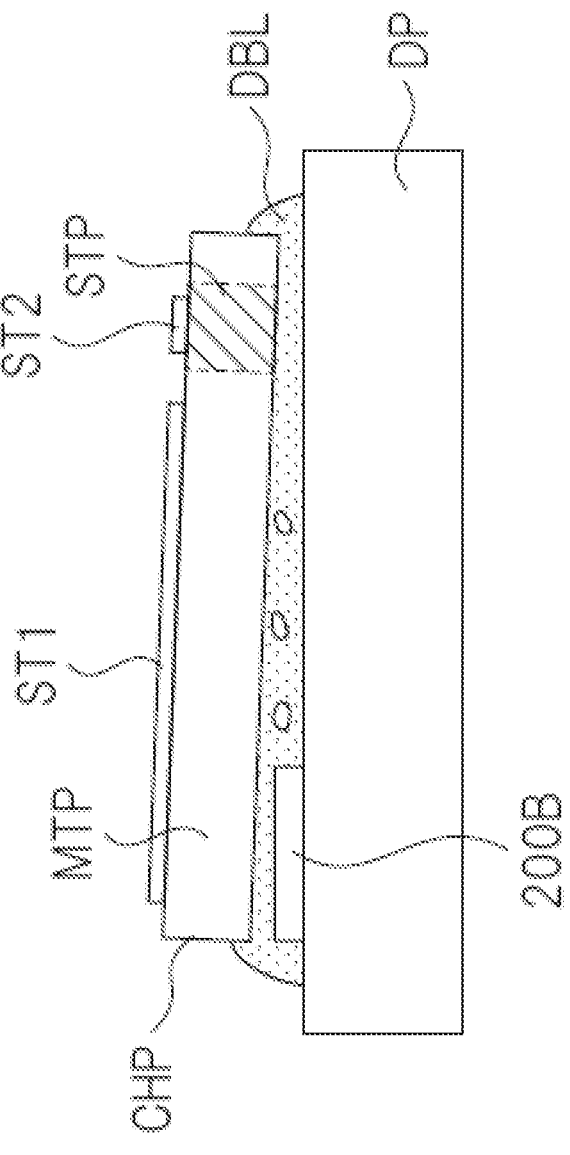
FIG. 17 is a diagram showing a modified example of the second embodiment.
Figure 18:
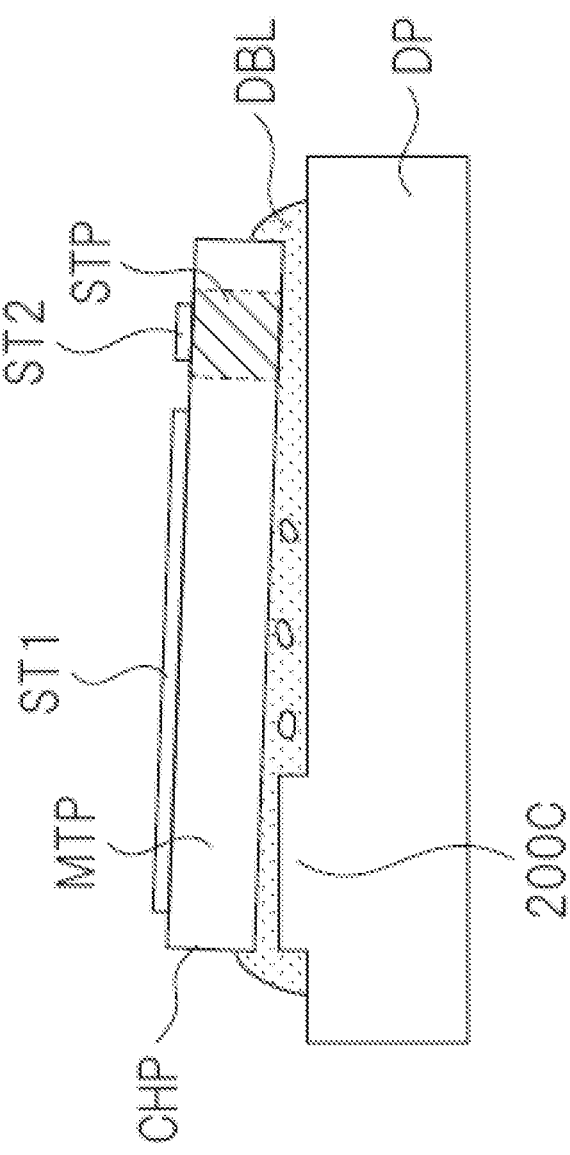
FIG. 18 is a diagram showing a modified example of the second embodiment.

For example, as illustrated in FIG. 9, the convex portion 200A described above can form the convex portion 100A on the front surface of the die pad DP by pressing the mold MD having the concave portion formed thereon against the front surface of the die pad DP. However, the process of forming the protrusions is not limited to this, and for example, as shown in FIG. 17, a protrusion 200B partially formed of a plating film can be formed on the die pad DP. Further, for example, as shown in FIG. 18, the front surface on the die pad DP may be partially etched to form the protrusion 200C.

Figure 19:
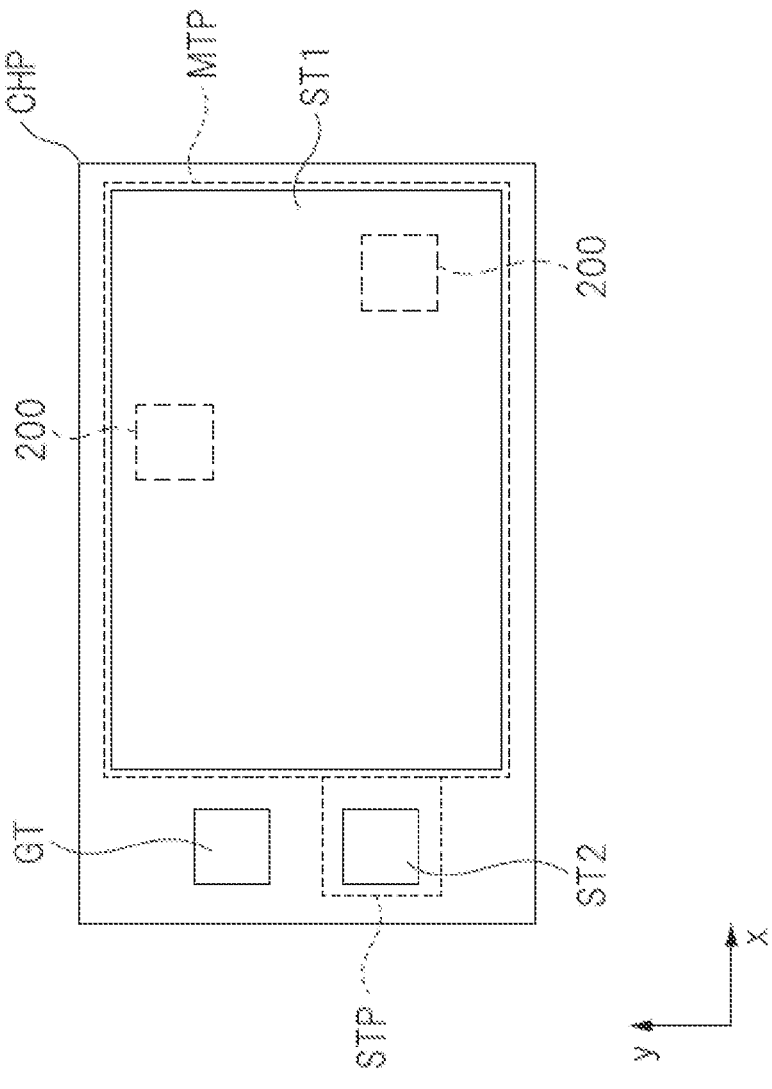
FIG. 19 is a diagram showing a modified example of the second embodiment.

Note that, for example, as shown in FIG. 19, a plurality of protrusions 200 may be provided so as to overlap with the main transistor forming portion MTP. As a result, the semiconductor chip CHP can be stably arranged while being inclined on the die pad DP.

The invention made by the present inventor has been described above in detail based on the embodiment, but the present invention is not limited to the embodiment described above, and it is needless to say that various modifications can be made without departing from the gist thereof.

What is claimed is:

1. A method of manufacturing a semiconductor device, comprising steps of:
   (a) forming a first convex portion on a front surface of a chip mounting portion; and
   (b) mounting a semiconductor chip on the front surface of the chip mounting portion via a conductive adhesive material, wherein the semiconductor chip includes: a main transistor forming portion in which a main transistor is formed; and
   a sense transistor forming portion in which a sense transistor is formed, and
   wherein, in the step of (b), the semiconductor chip is mounted on the front surface of the chip mounting portion such that the sense transistor forming portion of the semiconductor chip overlaps the first convex portion formed on the front surface of the chip mounting portion in the step of (a), and
   wherein, in the conductive adhesive material, a thickness of a first portion located between the sense transistor forming portion of the semiconductor chip and the chip mounting portion is less than a thickness of a second portion located between the main transistor forming portion of the semiconductor chip and the chip mounting portion.

2. The method according to claim 1, wherein, in the step of (a), the first convex portion is formed by pressing a mold against the front surface of the chip mounting portion.

3. The method according to claim 1, wherein, in the step of (a), the first convex portion is formed by partially providing a film on the front surface of the chip mounting portion.

4. The method according to claim 1, wherein, in the step of (a), the first convex portion is formed by selectively etching the front surface of the chip mounting portion.

5. The method according to claim 1, wherein a second convex portion is formed on the front surface of the chip mounting portion at a region overlapping with the main transistor forming portion of the semiconductor chip, the region not overlapping with the sense transistor forming portion of the semiconductor chip.

6. The method according to claim 5, wherein, in cross-sectional view, the semiconductor chip is disposed horizontally on the chip mounting portion.

7. The method according to claim 1, wherein the first convex portion formed on the front surface of the chip mounting portion is formed so as to include the sense transistor forming portion in a perspective plan view.

* * * * *